United States Patent [19]

Lundy et al.

[11] 4,395,600
[45] Jul. 26, 1983

[54] AUDITORY SUBLIMINAL MESSAGE SYSTEM AND METHOD

[76] Inventors: Rene R. Lundy, 3016 SE. 39th; David L. Tyler, 2939 SE. Taylor, both of Portland, Oreg. 97214

[21] Appl. No.: 210,645

[22] Filed: Nov. 26, 1980

[51] Int. Cl.³ .................... H04M 15/00; H04K 1/02
[52] U.S. Cl. .......................... 179/1.5 M; 340/348 E; 179/1 AA
[58] Field of Search ............... 179/1 AA, 1 P, 1.5 M; 340/348 E; 358/183, 22; 430/9; 178/17.5; 250/214 R; 352/130, 131, 201, 81

[56] References Cited

U.S. PATENT DOCUMENTS

| 625,627 | 5/1899 | Woody | 353/81 |
|---|---|---|---|
| 711,440 | 10/1902 | Relchenbach | 352/201 |
| 1,356,223 | 10/1920 | Sawyer | 352/55 |
| 2,073,370 | 3/1937 | Goldsmith et al. | 178/17.5 |
| 2,338,551 | 1/1944 | Stanko | 179/1 P |
| 2,409,058 | 10/1946 | Mitchell | 179/1 P |
| 2,501,327 | 3/1950 | Good | 179/1 P |
| 2,609,294 | 9/1952 | Prentice | 430/9 |
| 2,706,218 | 4/1955 | Wootten | 352/131 |
| 2,730,565 | 1/1956 | Owens | 358/183 |
| 2,784,246 | 3/1957 | Hurford | 358/183 |
| 2,788,386 | 4/1957 | Purington | 174/153 R |
| 2,808,455 | 10/1957 | Moore | 358/22 |
| 2,809,298 | 10/1957 | Cawein | 250/214 R |
| 2,931,857 | 4/1960 | Hammond, Jr. et al. | 352/130 |
| 2,941,044 | 6/1960 | Volkmann | 179/1 P |
| 2,969,428 | 1/1961 | Wittlig | 179/7.1 R |
| 3,060,795 | 10/1962 | Corrigan et al. | 352/131 |
| 3,173,136 | 3/1965 | Atkinson | 340/384 E |
| 3,278,676 | 10/1966 | Becker | 358/142 |
| 3,410,958 | 11/1968 | Cohen | 179/1 P |
| 3,579,233 | 5/1971 | Raschke | 340/384 E |
| 3,934,084 | 1/1976 | Munson et al. | 179/1 P |
| 3,934,085 | 1/1976 | Munson et al. | 179/1 P |
| 4,052,720 | 10/1977 | McGregor et al. | 179/1 P |
| 4,059,726 | 11/1977 | Watters et al. | 179/1.5 M |
| 4,061,874 | 12/1977 | Fricke et al. | 179/1 A |

OTHER PUBLICATIONS

Brit. Journal of Psychology, (1979), 254–258, Mykel et al., Emergence of Unreported Stimuli in Imagery as a Function of Laterality . . . .
Perceptual and Motor Skill, pp. 375–378, (1974), Zenhausern et al., "Differential Effect of Subliminal . . . ".
Proc. of 1978 IEEE, Region 3 Conf., 4/10–12/78, Atlanta, Becker et al., "Subliminal Communication: . . . ".
Applications of Subliminal Video and Audio Stimuli in . . . Commercial Settings, 3/28/80, Becker et al.
The Living Brain, W. Grey Walter, W. W. Norton and Co., 1953, pp. 83–113.
The Human Brain, John Pfeiffer, Harper Bros., 1955, pp. 156–161.
Strobe–The Lively Light, Howard Luray, Camera Craft Publishing, 1949, pp. 11–15.
"Electronic Magic", H. W. Secor, Radio Electronics, Jun. 1949, pp. 20–22.
"TV Video Switching", John Brush, Television Eng., Jul. 1951, pp. 12–15, 29.
"Fighting the Five Finger Discount", American Way, American Airlines, 11/80, pp. 72 et seq.
"Application of Signal Detection Theory to Subliminal and Supraliminal Accessory Stimulation", Zwosta and Zenhausern, Perceptual and Motor Skills, 1969, pp. 699–704.

*Primary Examiner*—Sal Cangialosi
*Attorney, Agent, or Firm*—Klarquist, Sparkman, Campbell, Leigh, Whinston & Dellett

[57] ABSTRACT

Ambient audio signals from the customer shopping area within a store are sensed and fed to a signal processing circuit that produces a control signal which varies with variations in the amplitude of the sensed audio signals. A control circuit adjusts the amplitude of an auditory subliminal anti-shoplifting message to increase with increasing amplitudes of sensed audio signals and decrease with decreasing amplitudes of sensed audio signals. This amplitude controlled subliminal message may be mixed with background music and transmitted to the shopping area. To reduce distortion of the subliminal message, its amplitude is controlled to increase at a first rate slower than the rate of increase of the amplitude of ambient audio signals from the area. Also, the amplitude of the subliminal message is controlled to decrease at a second rate faster than the first rate with decreasing ambient audio signal amplitudes to minimize the possibility of the subliminal message becoming supraliminal upon rapid declines in ambient audio signal amplitudes in the area. A masking signal is provided with an amplitude which is also controlled in response to the amplitude of sensed ambient audio signals. This masking signal may be combined with the auditory subliminal message to provide a composite signal fed to, and controlled by, the control circuit.

29 Claims, 5 Drawing Figures

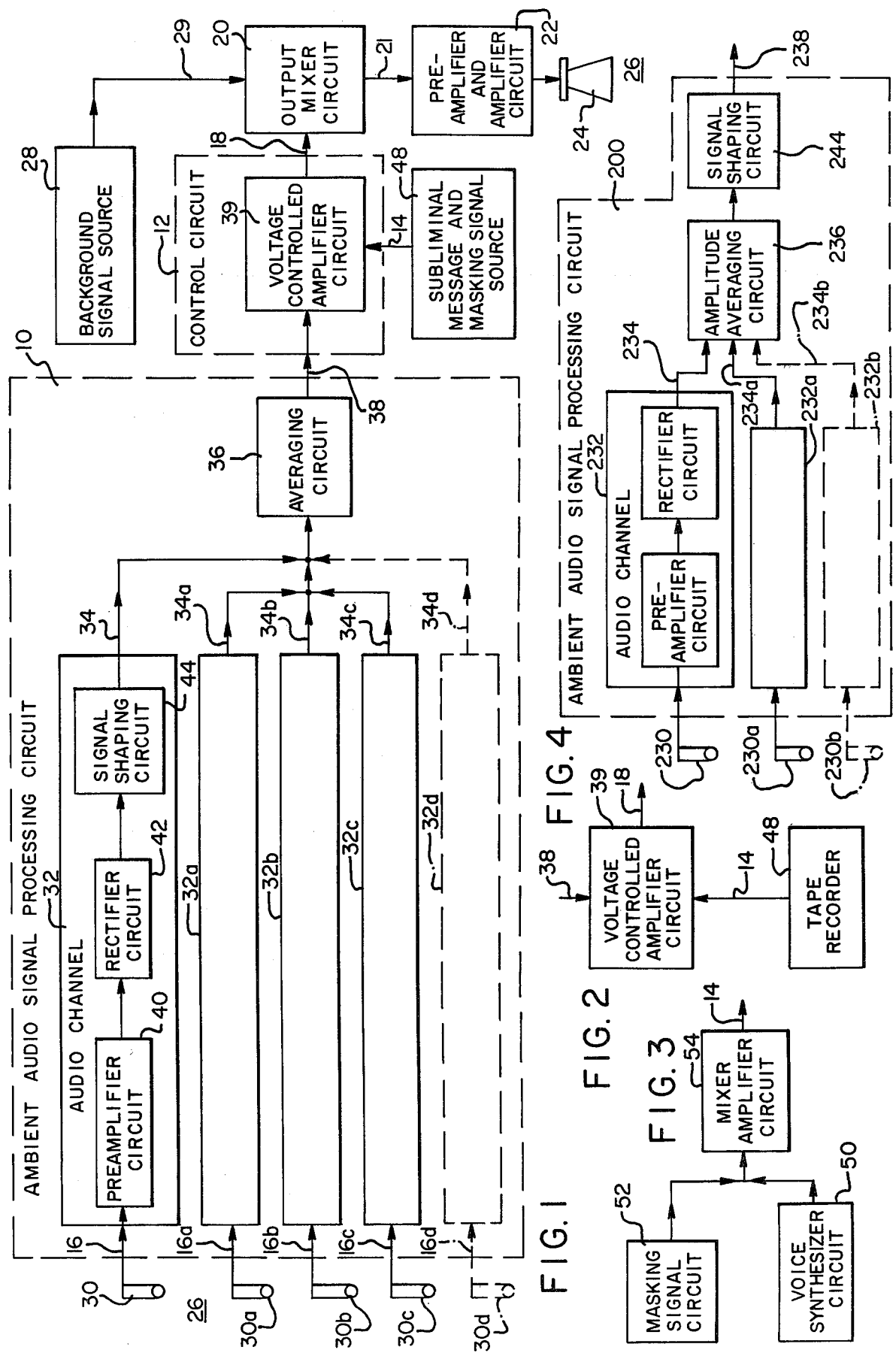

AUDITORY SUBLIMINAL MESSAGE SYSTEM AND METHOD

BACKGROUND OF THE INVENTION

The present invention relates to a system and method for providing subliminal auditory signals to an area such as a customer shopping area within a store. More particularly, the invention relates to such a system and method in which the amplitude of the subliminal signal is adjusted in response to the amplitude of ambient audio signals from the customer shopping area.

It has been established that auditory subliminal signals, that is, those presented below the conscious recognition level of the listener, can be used to influence the listener's behavior to some degree. Some early research into visual and auditory subliminal stimulation effects are exemplified in U.S. Pat. Nos. 3,060,795 of Corrigan, et al. and 3,278,676 of Becker.

In addition, Becker is understood to have experimented with the use of auditory subliminal messages to deter shoplifting by retail store customers. Although applicants have not seen or studied Mr. Becker's device, it is believed to combine an auditory subliminal message with background music. However, during non-peak shopping and other times when the store area is exceptionally quiet, the background music signal component in Becker must be much louder than the subliminal signal as otherwise the subliminal signal would be at a level such that it may be consciously recognized by a listener. In addition, as a result of this large difference between the amplitude of the background music and that of the subliminal message signal, the effectiveness of the Becker subliminal message is reduced. Also, Becker is understood to maintain his combined background music and subliminal message at a level sufficiently high enough to enable the music to be heard even under noisy store conditions. However, when the ambient audio signal level drops, such as during non-peak store traffic times, the combined background music and subliminal signal would remain the same and seem overly loud. Thus, Becker is simply not understood to control the amplitude of a subliminal message in response to ambient audio signals from an area.

Accordingly, there is a need for an auditory subliminal message system and method which solves these and other problems.

SUMMARY OF THE INVENTION

The present invention is a method and system for adjusting the amplitude of an auditory subliminal message in response to the amplitude of ambient audio signals from an area to which the subliminal message is to be transmitted. In accordance with one aspect of the invention, an audio signal processing circuit means receives signals representing the amplitude of audio signals in the area, such as a retail shopping area of a store. This processing circuit means produces a control signal for an amplitude adjustment or control circuit means which adjusts the amplitude or volume of an auditory subliminal signal which is to be transmitted to the area. The amplitude of the auditory subliminal signal is adjusted to increase with increasing sensed ambient audio signals and decrease with decreasing sensed ambient audio signals.

As a more specific aspect of the invention, a masking signal is generated and fed to the area. This masking signal has frequency and amplitude characteristics which cover or render the subliminal signal imperceptible to the conscious recognition level of a listener. In the preferred embodiment, the amplitude of this masking signal is also controlled in response to the sensed ambient audio signals so that its amplitude follows the amplitude of the adjusted subliminal message signal. The masking signal may be combined with the subliminal signal to provide a composite signal having an amplitude controlled by the control circuit in response to the control signal.

As a more specific feature of the invention, to reduce distortion of the subliminal message signal, the processing circuit means produces a control signal which causes the control circuit means to increase the amplitude of the auditory subliminal message signal slowly at a rate slower than the rate of change of the ambient audio signals at times when the ambient audio signals are increasing in magnitude. In addition, at times when the ambient audio signals are decreasing to minimize the possibility of conscious perception of the subliminal message signal, the processing circuit means produces a control signal which causes the control circuit means to decrease the amplitude of the subliminal signal at a fast rate.

It is accordingly one object of the invention to provide an improved auditory subliminal message system and method.

Another object of the invention is to provide an auditory subliminal message having an amplitude which is adjusted in response to ambient noise levels within an area to which the auditory subliminal message is to be transmitted.

A further object of the invention is to provide a method and system which adjusts the amplitude of an auditory subliminal message at one rate with increasing ambient audio signal levels in the area and at another, faster rate with decreasing ambient audio signal levels.

A still further object of the invention is to provide such a method and system in which the amplitude of an auditory subliminal signal is adjusted to rise at a rate slower than the rate of increases in ambient audio signal levels.

Another object of the invention is to provide an auditory subliminal message which is continuously maintained below the conscious perception level.

A further object of the invention is to provide an auditory subliminal message which is maintained below the conscious perception level of listeners in an area and which is adjusted in response to ambient audio signals in the area so as to remain close to the level of conscious perception.

Still another object of the invention is to provide an auditory masking signal for an auditory subliminal message, the masking signal having an amplitude which is adjusted in response to ambient noise levels in an area to which the auditory subliminal message is to be transmitted.

A more specific object of the invention is to provide an auditory subliminal message anti-shoplifting system and method.

These and other objects, features and advantages of the invention will become apparent with reference to the following drawings and description.

BRIEF DESCRIPTION OF THE DRAWING

In the drawing

FIG. 1 is a block diagram of an auditory subliminal message system in accordance with the present invention;

FIG. 2 is a block diagram illustrating one embodiment of an auditory subliminal message signal and masking signal source;

FIG. 3 is a block diagram showing another embodiment of an auditory subliminal message signal and masking signal source;

FIG. 4 is a block diagram showing an alternate ambient audio signal processing circuit.

DETAILED DESCRIPTION

General Description of Preferred Embodiment

Figure 5:
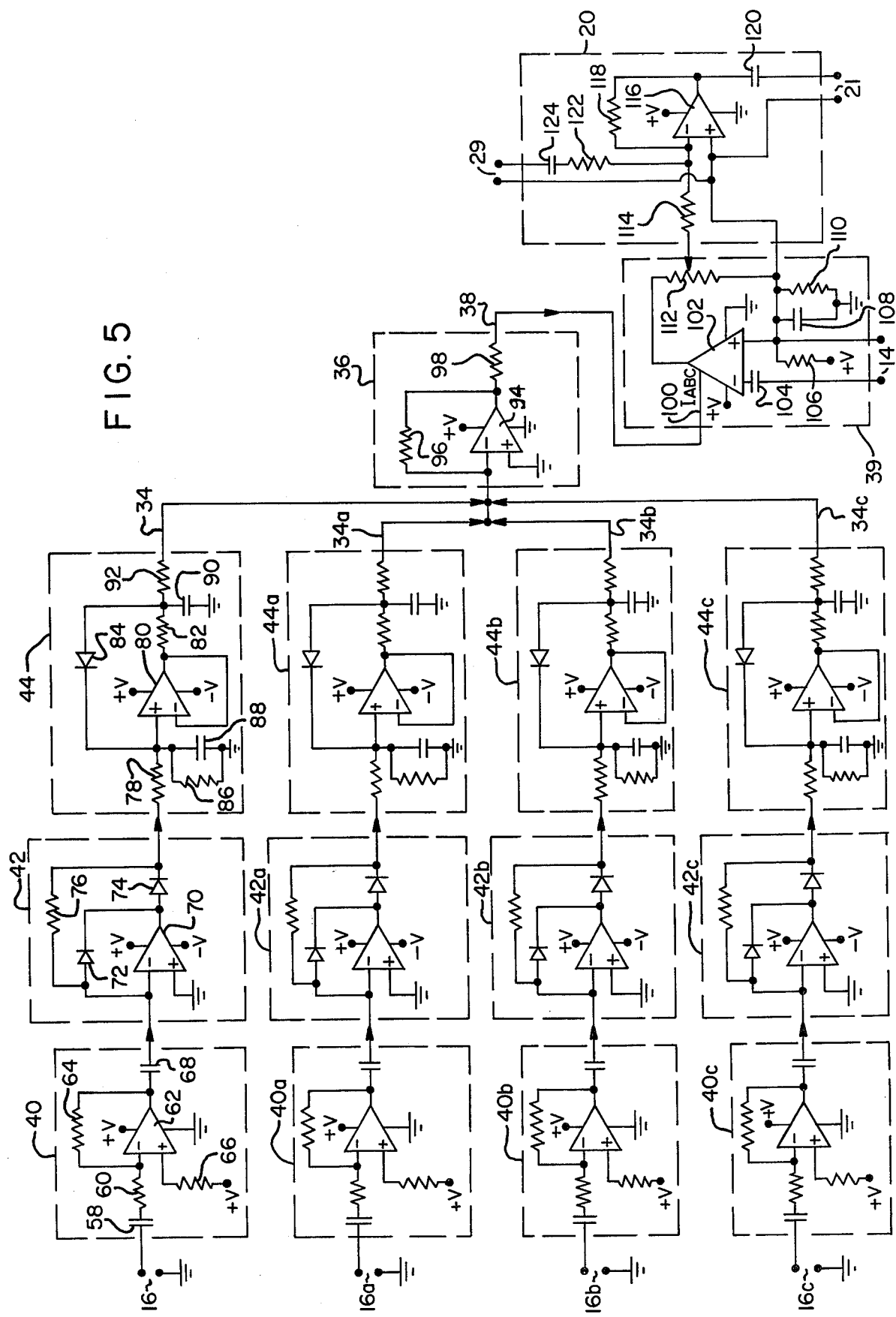
FIG. 5 is a detailed circuit schematic diagram of the ambient audio signal processing circuit and other portions of the circuit of FIG. 1.

It has now been discovered that in an environment with constantly changing ambient audio levels, such as in the shopping area of a store, it is desirable to adjust the amplitude of an auditory subliminal message signal to follow the amplitude of the ambient audio signals. That is, by increasing the amplitude of the auditory subliminal message with increasing ambient audio levels and decreasing the amplitude of the subliminal signal with decreasing ambient audio levels, the subconscious perception of the subliminal message by listeners is improved. This in turn increases the effectiveness of the subliminal message.

Therefore, with reference to FIG. 1, the system includes circuit means for controlling the amplitude of an auditory subliminal message signal in response to the level of ambient sounds in an area 26, such as the customer shopping area within a store, to which the subliminal message signal is to be transmitted. Such circuit means includes an ambient audio signal processing circuit 10 and a control circuit 12. Control circuit 12 is adapted to receive an auditory subliminal message signal input at 14 and processing circuit 10 has at least one input 16 for receiving signals representing the amplitude or volume of ambient audio signals within the area. Processing circuit 10 and control circuit 12 adjust the amplitude of the auditory subliminal message signal received at input 14, in response to the amplitude of ambient audio signals received at input 16, to produce an auditory subliminal message signal output at 18 having an amplitude which varies with variations in the level of ambient audio signals in the area.

The output signal at 18 is fed to an output circuit which, in the illustrated form, includes an output mixer circuit 20 having an input coupled to output 18, a preamplifier and amplifier circuit 22 with an input 21 coupled to the output of mixer circuit 20, and a speaker 24 for transmitting the amplitude adjusted auditory subliminal message signal to area 26. The circuit also may include an optional background auditory signal source 28 which produces music or other background auditory signals which are fed to an input 29 of the output mixer circuit 20. These background signals are combined within mixer circuit 20 with the amplitude controlled subliminal message signal and the combined signal is transmitted by speaker 24 to room 26.

The preferred embodiment of the system also includes at least one audio sensor means, such as microphone 30 positioned within the area 26. Microphone 30 detects ambient audio signals within the area and produces an electrical output signal representing these detected signals. The microphone output is fed to input 16 of ambient audio signal processing circuit 10.

Processing circuit 10 includes an audio channel 32 associated with microphone 30 for modifying the input 16 to produce an audio channel output signal at 34 which varies with variations in the ambient audio signal input at 16, as explained below. Preferably, plural microphones 30, 30a, 30b, 30c, 30d, etc. are provided for detecting ambient audio signals in various parts of the area 26. For convenience, these microphones may be positioned in the ceiling of the shopping area. A respective audio channel 32a, 32b, 32c and 32d is associated with each of the microphones 30a, 30b, 30c and 30d and produces output signals 34a, 34b, 34c and 34d in the same manner as the audio channel 32. The output signals 34 are averaged by an averaging circuit 36 to produce an output control signal at 38 which varies with variations in the amplitude of ambient audio signals sensed by the microphones throughout the store area 26.

In the embodiment of FIG. 1, each audio channel 32 includes a preamplifier circuit 40 for amplifying the input signal 16, a rectifier circuit 42 for rectifying the amplified input signal and a signal shaping circuit 44 for modifying the rectified ambient audio signal input from microphone 30, as explained below.

In connection with this signal shaping circuit, it has now been discovered that rapid changes of an amplitude of an auditory subliminal signal can distort it to such an extent that it becomes unrecognizable to subconscious perception. Hence, to reduce such distortion and increase the subconscious perceptibility of the subliminal signal, the signal shaping circuit adjusts the control signal to cause the amplitude of the auditory subliminal message signal at a rate which is slower than the rate of increase of ambient audio signals at times when the amplitude of such ambient signals is increasing. However, with sudden drops in the level of ambient audio signals, a slow drop in the amplitude of the subliminal message could lead to conscious perception of this message. This can be extremely disadvantageous in situations wherein it is desired to keep the existence of the subliminal message a secret. Therefore, the signal shaping circuit adjusts the control signal to cause the volume of the auditory subliminal message to drop at a faster rate upon a decrease in the volume of ambient audio signals.

Hence, with this form of signal shaping circuit 44, the control signal output at 38 of the averaging circuit 36 varies at one rate with increasing ambient audio signals and at another faster rate with decreasing ambient audio signals. Furthermore, control circuit 12 is responsive to this varying control signal to produce an amplitude adjusted auditory subliminal message output at 18 which increases at a first rate with increases in ambient audio signals and decreases at a second rate, faster than the first rate, with decreases in ambient audio signals. In addition, to prevent distortion of the subliminal message, the first rate is slower than the rate of increase of the ambient audio signals.

It has also now been discovered that time lags are introduced into an auditory subliminal system. Such time lags are primarily due to the amount of time required by ambient audio signals is travel to microphones and the time required by an amplitude controlled subliminal message to travel from speakers to a listener. Thus, no matter how quickly the system reduces the amplitude of the auditory subliminal message in response to declining ambient sound levels, a reduction in the amplitude of the subliminal message would lag the reduction in volume of ambient sound. Thus, a rapid drop in ambient sound level could momentarily leave the subliminal message signal at a level sufficiently high to be perceived by a listener. In certain applications this would prove extremely disadvantageous.

For example, if an anti-shoplifting subliminal system is used to deter shoplifting in a store, customers may be extremely reluctant to patronize the store if they consciously perceive a normally anti-shoplifting message and hence realize that such a system is in use. Thus, although a store may realize savings due to a reduction in shoplifting, its overall profits may suffer because of customer reluctance to patronize a store wherein such a system is in use. Hence, in such applications it is desirable to maintain the subliminal signal continuously below the conscious perception range of listeners. On the other hand, in other applications such as in connection with a weight loss class in which the listeners realize that an auditory subliminal weight loss message is being transmitted, it is not as critical to continuously maintain the subliminal message below conscious perception levels.

To solve this problem, the preferred embodiment of the system includes means for producing a masking signal which screens the auditory subliminal message and blocks its conscious perception, particularly during times when the volume of ambient noise drops quickly. Thus, as illustrated in FIG. 1, the system includes a subliminal message and masking signal source means 48 which produces the auditory subliminal message signal fed to input 14 of control circuit 12. In addition, source 48 includes means for providing a masking signal with amplitude and frequency characteristics which block conscious perception of the auditory subliminal message. The masking signal may bypass control circuit 12 and be fed directly to room 26. However, it is preferable that the amplitude of the masking signal also be controlled in response to the amplitude of ambient audio signals. Otherwise, when the room becomes very quiet, the masking signal could be so loud that it is readily perceived and annoying. Also, if the masking signal amplitude remained constant while the subliminal signal amplitude dropped in response to drops in ambient sound levels, the amplitude of the masking signal would become so large relative to that of the subliminal message, that subconscious perception of the subliminal message is impaired.

Although a separate control circuit may be provided for controlling the amplitude of the masking signals, preferably the masking signal is combined with the auditory subliminal message signal and the resulting composite signal is fed to input 14 of control circuit 12. As illustrated in FIG. 1, control circuit 12 may include a voltage control amplifier circuit 39 for adjusting the output 18 in response to the control signal input 38.

As shown in FIG. 2, subliminal message and masking signal source 48 may comprise a means such as a tape recorder for playing back a recording of a composite auditory subliminal message and masking signal. In an alternate form illustrated in FIG. 3, the subliminal message and masking signal source 48 may comprise a voice synthesizer circuit 50 which produces an auditory subliminal component of the composite subliminal and masking signals. One suitable voice synthesizer circuit 50 comprises a commercially available "Digitalker" kit produced by National Semiconductor Company. This kit includes a sixteen kilobite, eight bit memory chip No. MM52116 and a speech processor chip designated SPC. In addition, a masking signal circuit 52 is provided for producing the masking signal. This circuit may take various forms and comprise a white noise signal generator circuit such as a random noise oscillator with an internal shift register. One suitable generator is available from Radio Shack and designated random events generator chip No. S2688/MM5837. The masking signal circuit and voice synthesizer circuit outputs are fed to a commercially available mixer amplifier circuit 54, in which they are combined. The mixer circuit output comprises the composite auditory signal which is fed to input 14 of the control circuit 12.

As previously mentioned, the masking signal has frequency and amplitude components which make the auditory subliminal message signal incapable of conscious recognition by a listener. More specifically, the masking signal has frequency components which overlay the frequency components of the auditory subliminal message signal. In addition, the amplitude of the masking signal is slightly higher than the amplitude of the auditory subliminal message signal. More specifically, it has now been discovered that preferred results are obtained when the amplitude of the masking signal is continuously maintained approximately within the range of 3 db to 15 db above the amplitude of the subliminal message signal. Furthermore, that the best results occur when the masking signal is approximately 5 db above the amplitude of the auditory subliminal message signal. That is, with such relative amplitudes of the masking signal to the auditory subliminal message signal, a temporary screen is provided for the subliminal message at times, such as during rapid declines in ambient noise levels, when the subliminal message may otherwise become supraliminal. Also, with such relative amplitudes, the masking signal provides a satisfactory screen for the subliminal message without impairing satisfactory subconscious perception of the auditory subliminal message. It should be noted that with such relative amplitudes of the masking signal and subliminal message signal, the masking signal typically may not block conscious perception of the subliminal signal in a situation where the composite subliminal message and masking signal are at a high amplitude in relation to the volume of ambient audio signals. However, such conditions are prevented by controlling the amplitude of the composite signal in response to ambient audio signals, as explained above.

FIG. 4 illustrates an alternate ambient audio signal processing circuit. Components of this circuit which are similar to those of the FIG. 1 form of processing circuit have numbers incremented by two hundred over the corresponding numbers in FIG. 1. Hence, these components will not be described in detail. Unlike the FIG. 1 form of processing circuit, the audio channels of the FIG. 4 embodiment do not include the signal shaping circuit. Instead, the output of the respective rectifier circuits are averaged by an averaging circuit 236 prior to signal shaping by a signal shaping circuit 244 in the manner explained above.

DETAILED CIRCUIT DESCRIPTION

With reference to FIG. 5, a four-channel audio signal processing circuit is illustrated. Since each of the illustrated channels is identical, only the upper channel will be described in detail.

The audio channel includes series connected preamplifier circuit 40, rectifier circuit 42, and signal shaping circuit 44. The input 16 to the channel is obtained from the microphone 30 (FIG. 1) and thus fluctuates in response to changes in ambient audio signals detected by the microphone. Input 16 and hence the microphone output is fed to preamplifier circuit 40. More specifically, this input is coupled by a 0.1 microfarad capacitor 58 through a one kilohm gain establishing resistor 60 to the inverting input of an operational amplifier 62. The output of amplifier 62 is connected through a one megohm feedback resistor 64 to its inverting input. The gain of amplifier 62 is established by the ratio of resistors 64 and 60 and, with these particular resistors is set at approximately one thousand. Also, a positive biasing voltage V is fed through a two megohm biasing resistor 66 to the noninverting input of amplifier 62. With the circuit components utilized in the FIG. 5 circuit, the positive biasing voltage is six volts and a negative biasing voltage is at negative six volts. One suitable amplifier 62 comprises one amplifier section of an LM3900 quad Norton operational amplifier. When connected as described above, amplifier 62 inverts and amplifies the input signal at 16.

To convert the input at 16 to a direct current signal, 0.1 microfarad capacitor 68 couples the output of amplifier 62 to the inverting input of an amplifier 70 connected as an amplifying, inverting, precision rectifier. Rectifier circuit 42 produces an output signal comprising a positive half-cycle inverted and amplified version of the input signal. More specifically, the output of amplifier 70 is connected to the anode of a diode 74 having its cathode connected through a one megohm feedback resistor 76 to the inverting input of amplifier 70. Thus, the positive half-cycles of the output signal from amplifier 70 are coupled through diode 74 and resistor 76 to the inverting input of amplifier 70. In contrast, the negative half-cycle output signals from amplifier 70 are blocked by diode 74. However, because the output of amplifier 70 is connected to the cathode of a diode 72 having its anode coupled to the inverting input of amplifier 70, these negative going half cycles are coupled through diode 72 to the inverting input of amplifier 70. The output of rectifier 42 is taken at the cathode of diode 74 and comprises a positive representation of the input signal 16 and hence of the amplitude of ambient audio signals detected by microphone 30. A suitable amplifier for accomplishing this rectification comprises one amplifier section of a type 324 quad operational amplifier.

The rectified output signal from rectifier circuit 42 is fed to signal shaping circuit 44. That is, the output of the rectifier circuit is fed to a resistor-capacitor network. This network comprises a ten kilohm resistor 78 coupled between the output of rectifier 42 and the noninverting input of an operational amplifier 80, a one microfarad capacitor 88 which couples the noninverting input of amplifier 80 to ground, and a one hundred kilohm resistor 86 in parallel with capacitor 88. This network has a charging time constant of approximately 0.01 seconds and discharging time constant of approximately 0.1 seconds. Amplifier 80 may comprise one amplifier section of a type 324 quad operational amplifier and has its output coupled directly through a feedback loop to its noninverting input so that the amplifier acts as a voltage follower. The output of amplifier 80 drives another resistor-capacitor network including a five hundred kilohm resistor 82 and a ten microfarad capacitor 90. The time constant of this latter resistor-capacitor is approximately five seconds. Also, a diode 84, having a turn-on voltage of approximately 0.7 volts, has its anode connected to the contact between resistor 82 and capacitor 90 and its cathode connected to the noninverting input of amplifier 80. The positive side of capacitor 90 is coupled through a one hundred kilohm resistor 92 to the output 34 of the audio channel. This output 34 is then fed to averaging circuit 36 as explained below.

For reasons explained above, signal shaping circuit 44 operates in the following manner to produce an output on line 34 which increases at one rate with increasing sensed ambient audio signals and which decreases at a rate faster than said one rate with decreases in the sensed audio signals. Furthermore, because of the delays within the signal shaping circuit 44 resulting from charging time of the resistor-capacitor networks, the output signal on line 34 will increase at a slower rate than the rate of increase of ambient noise signals. This slows the rate of change of the audio subliminal signal and thereby minimizes rapid amplitude fluctuations therein and resulting distortions. That is, as the amplitude of ambient audio signals increases, the signal reaching capacitor 90 also increases. However, because of the relatively long charging time constant of the resistor-capacitor network including capacitor 90, capacitor 90 charges slowly. Hence, under those conditions the output on line 34 comprises a slowly rising DC signal. Furthermore, because the voltage at the anode of diode 84 is greater than or equal to the voltage at its cathode, diode 84 is nonconducting. In contrast, upon a sudden decrease in the amplitude of the sensed ambient audio signals, the input to operational amplifier 80 quickly decreases. As a result, the voltage at the cathode of diode 84 drops below the voltage at the anode of this diode sufficiently to cause the diode to conduct. While conducting, diode 84 establishes a short circuit between the positive side of capacitor 90, through resistor 86 and to ground so that capacitor 90 rapidly discharges. Therefore, the output signal at 34 drops rapidly and at a rate much faster than the rate at which the output 34 rose with increases of the amplitude of the ambient audio signals. Of course, by adjusting the time constants of the resistor-capacitor circuits within shaping circuit 44, the rate of change of the output 34 in response to changes in ambient audio signals can be adjusted as desired.

The outputs of the audio channels are fed to averaging circuit 36. More specifically, resistor 92 and a similar resistor in each of the other audio channels couple the DC outputs from these channels to the inverting input of an operational amplifier 94 connected to average the signals received at its inverting input. Amplifier 94 may comprise a type 741 operational amplifier. The noninverting input of this amplifier is grounded and a twenty-five kilohm feedback resistor 96 couples the output of amplifier 94 to its inverting input. In addition, a ten kilohm current limiting resistor 98 couples the output of amplifier 94, which comprises the control signal 38, to control circuit 12. More specifically, with this particular circuit, control signal 38 comprises a varying direct current signal. Resistor 96 is set at one-quarter the value of the input resistors 92 so that the gain of the averaging amplifier 94 is established at 0.25. In the event only one microphone is used to detect ambient audio signals, then averaging, of course, is not performed.

Control circuit 12 controls the amplitude of the composite auditory subliminal message and masking signal received at its input 14 in response to the control signal on line 38 and thereby in response to changes in ambient sound levels within room 26. More specifically, the control signal on line 38 is used as a gain control for an amplifier 102 of circuit 39. Amplifier 102 may comrise a type CA3080A operational transconductance amplifier connected as a voltage controlled amplifier. The control signal on line 38 is fed to the control signal input $I_{ABC}$ of amplifier 102. Amplifier 102 is conducted in a conventional manner as a single supply operational amplifier. Also, the positive reference voltage is fed through a voltage divider network including a forty-seven kilohm resistor 106 and forty-seven kilohm resistor 110 to ground. The three-volt signal available from this divider is supplied to the noninverting input of amplifier 102. A ten microfarad capacitor 108 couples this latter input to ground to remove stray alternating current signals at this input. In addition, the composite subliminal auditory message signal and masking signal is fed to input 14 of voltage control amplifier circuit 39. That is, these signals are coupled through a ten microfarad capacitor 104 to the inverting input of amplifier 102. The output of amplifier 102 is fed to one side of a ten kilohm potentiometer 112 having its other side coupled to ground through resistor 110. The output of circuit 39 is taken from potentiometer 112 and, as explained above, comprises a composite auditory subliminal message signal and masking signal having an amplitude adjusted in response to ambient audio signals within area 26. The wiper arm of potentiometer 112 also permits adjustment of the amplitude of the voltage controlled composite auditory subliminal signal and masking signal. Hence, this amplitude can be selectively adjusted to make the masking signal component more clearly consciously perceptible to provide an indication that the system is operational.

The gain controlled output signal of circuit 39 is connected through a one hundred kilohm resistor 114 to the inverting input of an operational amplifier 116 within output mixer circuit 20. Amplifier 116 may comprise a type 741 operational amplifier connected as an inverting mixer. Any optional background audio signals, such as music, may be fed to input 29 of output mixer circuit 20. This input is coupled by a ten microfarad coupling capacitor 124 in series with a one hundred kilohm input resistor 122 to the inverting input of amplifier 116. A one hundred kilohm feedback resistor is also coupled between the output of amplifier 116 and its inverting input. Since resistors 114, 118 and 122 are all equal, the gain of the amplifier 116 is established at one. The output of amplifier 116 is coupled through a ten microfarad coupling capacitor 120 to preamplifier and amplifier circuit 22 (FIG. 1) and hence to the speaker 24 located in the area 26.

In a specific anti-shoplifting application, an auditory subliminal message signal designed to encourage honesty is provided. One such signal comprises the phrase "I am honest, I will not steal". This auditory subliminal message signal is combined with a white noise masking signal to provide a composite signal input to the control circuit 12. The amplitude of this composite signal is then adjusted within control circuit 12, as explained above, in response to changes in the amplitude of ambient audio signals detected within the shopping area of a store. The amplitude controlled composite signal is then transmitted to the shopping area so that the subliminal message is subconsciously perceived by individuals within the store.

It has now been experimentally determined that, although shoplifting and theft are not completely eliminated, significant reductions in these losses have resulted in such an application of the system of this invention.

Having illustrated and described the principles of our invention with reference to several preferred embodiments, it should be apparent to those persons skilled in the art that such embodiments may be modified in arrangement and detail without departing from such principles. We claim as our invention all such modifications as come within the true spirit and scope of the following claims.

We claim:

1. An auditory subliminal message system for an area comprising:
   ambient audio signal processing circuit means adapted to receive an input representing ambient audio signals in the area, said ambient signal processing means comprising means for producing a control signal output which continuously varies with variations in the received input and thereby with variations in the ambient audio signals in the area; and
   subliminal message control circuit means having a first input adapted to receive an auditory subliminal message signal, said control circuit means having a second input coupled to said ambient signal processing means for receiving said control signal output, and said control circuit means comprising means for continuously adjusting the amplitude of the received auditory subliminal message signal and for producing an adjusted output signal comprising the amplitude adjusted auditory subliminal message signal, the adjusted output signal being adapted for transmission to the area and having an amplitude which varies in response to said control signal so as to increase with increases in amplitude of ambient audio signals in the area and decrease with decreases in amplitude of ambient audio signals in the area.

2. A system according to claim 1 in which said ambient audio signal processing circuit means changes said control signal at one rate with increases in amplitude of ambient audio signals in the area and changes it at a faster rate with decreases in amplitude of ambient audio signals in the area, said control circuit means comprising means responsive to said control signal to produce an adjusted auditory subliminal message output signal which has an amplitude which increases at a first rate with increases in the amplitude of ambient audio signals in the area and which decreases at a second rate faster than the first rate with decreases in the amplitude of ambient audio signals in the area.

3. An auditory subliminal message system for an area comprising:
   audio sensor means for sensing ambient audio signals in the area and for producing an ambient audio output signal representing the volume of the sensed ambient audio signals;
   means having an input coupled to the output of said audio sensor means for producing a subliminal message output signal with a volume which follows the volume of the sensed ambient audio signals in the area.

4. A system according to claim 3 in which said last named means includes:
sublimimal message source means for providing an auditory subliminal message output signal; and
volume control circuit means having an input coupled to the output of said audio sensor means and an input coupled to the output of said subliminal message source means, said volume control circuit means comprising means for adjusting the volume of the received subliminal message output signal in response to the received ambient audio output signal so as to produce a modified subliminal message output signal which comprises the volume adjusted received subliminal message output signal.

5. A system according to claim 3 in which said last named means comprises means for producing a subliminal message output signal at a volume which increases in response to increases in the volume of sensed ambient audio signals at a rate slower than the rate of increase of the sensed ambient audio signals.

6. A system according to claim 5 in which said last named means comprises means for producing a subliminal message output signal at a volume which decreases in response to decreases in the volume of sensed ambient audio signals at a rate which is faster than the rate the subliminal message output signal increases in response to increases in the volume of sensed ambient audio signals.

7. An auditory subliminal message system for an area comprising:
at least one audio sensor means for sensing ambient audio signals in the area and for producing an ambient audio output signal representing the amplitude of the sensed ambient audio signals;
subliminal message source means for providing an auditory subliminal message output signal;
control circuit means coupled to the output of said audio sensor means and to said subliminal message source means for adjusting the amplitude of the subliminal message output signal so as to follow the amplitude of the sensed ambient audio signals; and
masking signal source means for providing and combining a masking signal having frequency characteristics and an amplitude such that when the masking signal is combined with the amplitude adjusted subliminal message output signal it renders the adjusted subliminal message output signal outside of the conscious recognition range.

8. A system according to claim 7 in which said subliminal message source means comprises means for producing a repetitive auditory subliminal message output signal.

9. A system according to claim 7 in which said subliminal message source means and said masking signal source means comprise means for providing a composite signal which includes the auditory subliminal message output signal as one component and which includes the masking signal as another component;
said control circuit means comprising means for adjusting the amplitude of the composite signal so as to follow the amplitude of the sensed ambient audio signals.

10. A system according to claim 9 including system testing means for selectively adjusting the amplitude of the composite signal to bring the masking signal into the conscious recognition range and thereby indicate the system is operating.

11. A system according to claim 7 in which said masking signal source means provides a masking signal having an amplitude which is in the range of approximately 3 db to 15 db greater than the amplitude of the amplitude adjusted subliminal message output signal.

12. A system according to claim 11 in which said masking signal source means provides a masking signal having an amplitude which is approximately 5 db greater than the amplitude of the amplitude adjusted subliminal message output signal.

13. A system according to claim 7 in which said masking signal source means comprises a white noise signal generator.

14. A system according to claim 9 in which said means for providing a composite signal comprises an audio recording playback means for playing back a recording of the composite signal.

15. A system according to claim 9 in which said means for providing a composite signal includes voice synthesizer means for providing the auditory subliminal signal component.

16. A system according to claim 15 in which said means for providing a composite signal includes white noise signal generator means for providing the masking signal component and mixer circuit means for combining the output of said voice synthesizer means and the output of said white noise signal generator means to provide an output from said mixer circuit means which comprises the composite signal.

17. A system according to claim 9 including output circuit means having at least one audio speaker means for transmitting the amplitude adjusted composite signal to the area.

18. A system according to claim 7 in which said control circuit means is also coupled to said masking signal source means and comprises means for adjusting the amplitude of the masking signal so as to follow the amplitude of the sensed ambient audio signals.

19. An auditory subliminal message system for an area comprising:
at least one audio sensor means for sensing ambient audio signals in the area and for producing an ambient audio output signal representing the amplitude of the sensed ambient audio signals;
subliminal message source means for providing an auditory subliminal message output signal;
masking signal source means for providing and combining a masking signal having frequency characteristics and an amplitude such that when the masking signal is combined with the amplitude adjusted subliminal message output signal it renders the adjusted subliminal message output signal outside of the conscious recognition range;
ambient audio signal processing circuit means coupled to the output of said audio sensor means for producing a control signal which varies with variations in the amplitude of the sensed ambient audio signals;
amplitude control circuit means coupled to said subliminal message source means, to said masking signal source means and to said ambient audio signal processing circuit means for controlling the amplitude of said auditory subliminal message and the amplitude of said masking signal in response to the control signal from said ambient audio signal processing circuit means such that the amplitudes of said auditory subliminal signal and of said masking signal increase with increasing amplitudes of the sensed ambient audio signals and decrease with decreasing amplitudes of the sensed ambient audio signals; and output circuit means including speaker means for transmitting the amplitude controlled auditory subliminal message output signal and the amplitude controlled masking signal to the area.

20. A system according to claim 19 in which said ambient audio signal processing circuit means includes an audio channel circuit means associated with each said sensor means.

21. A system according to claim 20 including plural audio sensor means and plural audio channel means, each said audio channel means including rectifier circuit means having an input coupled to the output of its associated audio sensor means for receiving and producing a rectified output signal representing the amplitude of the ambient audio signals sensed by the associated audio sensor means, each said audio channel means also including signal shaping circuit means having an input coupled to the output of said rectifier means for producing a shaped output signal which increases at a first rate in response to increases in the rectified output signal which corresponds to increases in the amplitude of the ambient audio signals sensed by the associated audio sensor means, the shaped output signal decreasing at a second rate which is faster than the first rate in response to decreases in the rectified output signal which corresponds to decreases in the amplitude of the ambient audio signals sensed by the associated audio sensor means; and said system also including averaging circuit means having an input coupled to the outputs of said signal shaping circuit means for receiving and averaging the shaped output signals to produce a control signal comprising the average of the received shaped output signals.

22. A system according to claim 20 including plural audio sensor means and plural audio channel means, each said audio channel means including rectifier circuit means having an input coupled to the output of its associated audio sensor means for receiving and producing a rectified output signal representing the amplitude of the ambient audio signals sensed by the associated audio sensor means;

said system also including averaging circuit means having an input coupled to the outputs of said rectifier circuit means for receiving and averaging the rectified output signals to produce an averaging circuit output signal comprising the average of the received rectified output signals; and signal shaping circuit means having an input coupled to the output of said averaging circuit means for producing a shaped output signal which increases at a first rate in response to increases in the averaging circuit output signal which corresponds to increases in the amplitude of the sensed ambient audio signals, the shaped output signal decreasing at a second rate which is faster than the first rate in response to decreases in the averaging circuit output signal which correspond to decreases in the amplitude of the sensed ambient audio signals.

23. A system according to claim 21 or 22 in which the first rate is slower than the rate of increase of the sensed ambient audio signals.

24. A system according to claim 19 in which said output circuit means includes means for combining background audio signals, such as music, with the amplitude controlled auditory subliminal signal prior to transmitting this latter signal to the area.

25. A system according to claim 21 in which the control signal comprises a control voltage and in which said amplitude control circuit means comprises a voltage controlled amplifier circuit.

26. A method of reducing shoplifting in a customer area of a store comprising:

sensing ambient audio signals from the area;
providing an auditory anti-shoplifting subliminal message signal;
adjusting the amplitude of the subliminal message signal to follow the amplitude of the sensed audio signals; and
transmitting the amplitude adjusted subliminal message signal to the area.

27. A method according to claim 26 in which the step of adjusting the amplitude comprises the steps of increasing the amplitude at a first rate with increasing amplitudes of the sensed audio signals and decreasing the amplitude at a second rate faster than the first rate with decreasing amplitudes of the sensed audio signals.

28. A method according to claim 26 or 27 including the steps of providing a masking signal having amplitude and frequency characteristics which when combined with the auditory subliminal message signal renders the subliminal message signal below the level of conscious recognition;

adjusting the amplitude of the masking signal to follow the amplitude of the sensed audio signals; and
transmitting the amplitude adjusted masking signal to the area.

29. A method according to claim 28 in which the step of providing a subliminal message signal comprises the step of providing a composite signal having the auditory subliminal message signal as one component and the masking signal as another component;

the step of adjusting the amplitude comprises the step of adjusting the amplitude of the composite signal to follow the amplitude of the sensed audio signals; and
the step of transmitting comprises the step of transmitting the amplitude adjusted composite signal to the area.

* * * * *

UNITED STATES PATENT AND TRADEMARK OFFICE
CERTIFICATE OF CORRECTION

PATENT NO. : 4,395,600
DATED : July 26, 1983
INVENTOR(S) : Rene R. Lundy and David L. Tyler It is certified that error appears in the above-identified patent and that said Letters Patent are hereby corrected as shown below:

On the title page
In the References Cited:

"Relchenbach" should be --Reichenbach--.

Column 4, line 67, "is" should be --to--.

Column 9, line 9, "comrise" should be --comprise--.

Signed and Sealed this

Eighteenth Day of October 1983

[SEAL]

Attest:

GERALD J. MOSSINGHOFF

Attesting Officer

Commissioner of Patents and Trademarks